(12) United States Patent
Laureanti

(10) Patent No.: US 6,521,467 B2
(45) Date of Patent: Feb. 18, 2003

(54) CHARACTERIZING SEMICONDUCTOR WAFERS WITH ENHANCED S PARAMETER CONTOUR MAPPING

(75) Inventor: Steven J. Laureanti, Lewisville, TX (US)

(73) Assignee: Ericsson, Inc., Richardson, TX (US)

( * ) Notice: Subject to any disclaimer, the term of this patent is extended or adjusted under 35 U.S.C. 154(b) by 67 days.

(21) Appl. No.: 09/745,752

(22) Filed: Dec. 22, 2000

(65) Prior Publication Data

US 2002/0113613 A1 Aug. 22, 2002

(51) Int. Cl.$^7$ .......................... H01L 21/66; G01R 31/01
(52) U.S. Cl. ............................ 438/12; 438/17; 324/759
(58) Field of Search ................................. 438/5, 10, 11, 438/12, 14, 15, 17, 18; 324/754, 759, 765, 769; 700/121

(56) References Cited

U.S. PATENT DOCUMENTS

| | | | |
|---|---|---|---|
| 4,853,624 A | * | 8/1989 | Rabjohn .................... 324/72.5 |
| 4,908,570 A | * | 3/1990 | Gupta et al. |
| 5,003,253 A | * | 3/1991 | Majidi-Ahy et al. ....... 324/72.5 |
| 5,654,204 A | * | 8/1997 | Anderson .................... 438/15 |
| 6,194,739 B1 | * | 2/2001 | Ivanov et al. ................. 257/48 |

FOREIGN PATENT DOCUMENTS

GB  2 316 534 A  *  2/1998

OTHER PUBLICATIONS

Larson III et al., "Modified Butterworth–Van Dyke Circuit for FBAR Resonators and Automated Meausurement System", Oct. 2000, IEEE Ultrasonics Symposium, pp. 863–868.*
Basu et al., "A Membrane Quadrant Probe for R&D applications", Jun. 1997, IEEE MTT-S Digest, pp. 1671–1673.*

* cited by examiner

Primary Examiner—Michael Sherry
Assistant Examiner—Evan Pert
(74) Attorney, Agent, or Firm—Bingham McCutchen LLP

(57) ABSTRACT

A system, and methods of its use, for characterizing semiconductor wafers with enhanced S parameter contour mapping employ small signal scatter parameter measurements of a representative sample of die to create a contour map of a wafer surface. Those die which fail to meet performance specifications are marked as bad die before the wafer is sent to a back-end process, where the unmarked good die are extracted and assembled into working products. By using enhanced S parameter mapping for characterizing the die, only those die marked as bad die need be discarded. Thus, instead of scrapping an entire wafer die lot based on the failure of a single die from that wafer, the wafer sort yield may be dramatically increased. The increase in wafer sort yield in turn, increases total production yield.

30 Claims, 7 Drawing Sheets

| Yield Formula | Yield Measurement Point | Typical Yield Values | Factors Affecting Yield |
|---|---|---|---|
| $\dfrac{[\text{\# wafers out}]}{[\text{\# wafers in}]}$ | Wafer Fab | 88% | •Number of processing steps<br>•Process defects including surface irregularities<br>•Wafer breaking or warping |
| $\dfrac{[\text{\# functional die}]}{[\text{\# die on wafer}]}$ | Wafer Sort | 65% | •Wafer diameter<br>•Die size<br>•Circuit density |
| $\dfrac{[\text{\# packaged die passing final test}]}{[\text{\# good die started into packaging}]}$ | Packaging | 92% | •Wafer thickness<br>•Heat generation and sensitivity<br>•Die separation (scribing and sawing) |
| Wafer Sort * Wafer Sort Yield * Packaging Yield | Total Production Yield | 53% | |

CHARACTERIZING SEMICONDUCTOR WAFERS WITH ENHANCED S PARAMETER CONTOUR MAPPING

FIELD OF THE INVENTION

The field of the present invention relates generally to semiconductor wafer characterization and more specifically to using scatter parameter contour mapping for transistor wafer characterization.

BACKGROUND

A chief determinant of a profitable semiconductor manufacturing operation is the maintenance of a high production yield. The worldwide semiconductor market is growing at a double-digit clip and is forecast to reach $250 billion by the year 2003. The factors driving the growth in the semiconductor manufacturing industry include such trends as the digital home, the global communications explosion, personal mobility and e-commerce. Improving manufacturing productivity remains a key factor in sustaining growth in the industry.

The semiconductor sector has typically tolerated a much lower and a much broader range of production yields running between 20 percent and 80 percent. These figures, while strikingly low by the standards of other manufacturing sectors, are often justified by citing the challenges and circumstances unique to the semiconductor manufacturing environment. The exacting requirements of clean rooms together with the large number of processes required to develop submicron components increase the likelihood of mistakes and failure in the process. Also, defective parts cannot be unbolted, replaced, or re-machined as is possible in other manufacturing sectors such as automotive production.

Device fabrication is commonly thought to take place in a series of four stages (depicted in FIG. 1) as adapted from Van Zant, Peter, *Microchip Fabrication, A Practical Guide to Semiconductor Processing*, Fourth Edition, McGraw Hill, 2000, p. 85. Stage 1 is the preparation stage where a crystalline silicon ingot is grown and purified from sand. It is here that individual wafers are prepared and "sliced" from the ingot. Stage 2 is the fabrication, or device fabrication stage. Layering, patterning, doping, and heat treatment are among the technologies employed during this stage to create the chips, called die, that become the electronic components in the final packaged product. In the fabrication stage, stage 3, precision electrical testing of individual die is performed. Usually only a representative sample of the total number of die on the wafer is selected from the wafer for testing. This stage is sometimes called the wafer sort stage because bad die are sorted from good die based on the results of the electrical tests. Many different measurements may be taken during the test phase using sophisticated manufacturing test equipment, or simple manual techniques. Though the tests employed are electrical in nature, they are crucial in pinpointing problems in process quality. In the final packaging stage, stage 4, the die are packaged before being placed into production as live electronic components. Packaging takes many forms but in every case the package chosen helps to protect the product from the harsh operating environment in which the product will operate.

Of chief concern to the manufacturing engineer is a quantity known as total production yield. Total production yield is particularly vulnerable to the wafer sort stage of the fabrication process. FIG. 2 summarizes the major considerations that concern manufacturing yield as adapted from Van Zant, Peter, *Microchip Fabrication, A Practical Guide to Semiconductor Processing*, Fourth Edition, McGraw Hill, 2000. Total production yield is defined to be the product of three yield measures taken at three yield measurement points: wafer fabrication, wafer sort, and packaging. Mathematics restricts the total production yield to a value no higher than the lowest of these three yield values. Industry statistics show that the wafer sort yield is historically the lowest of the three yields. Thus, from the standpoint of process improvement, efforts to boost the wafer sort yield have a direct impact on improving the overall production yield.

By way of example, FIG. 3 represents a flow diagram of a known laterally-diffused metal oxide semiconductor ("LDMOS") power transistor wafer sort process. The LDMOS wafer begins its journey through the wafer sort process after first completing a front-end fabrication process. Step 305 represents the beginning of the wafer sort. Wafers are completely diced, and die lot numbers are assigned to wafers to track the origin of each individual die. In step 310, the die samples are chosen, ensuring that at least one die sample is taken from each quadrant of the wafer. This helps to guarantee a uniform characterization of die across the wafer surface. However, a total sample size of only four devices per wafer is not uncommon. In step 315, each sample die is fully packaged as a functional product prior to testing. Packaging is necessary largely to provide heat dissipation because the high power, large signal probes placed on the wafer during testing cause the wafer to radiate a lot of heat.

The heart of the product test is the DC and RF test cycle that begins with step 345. The battery of tests performed seeks to characterize the electrical behavior of the transistor device. The tests come in one of two broad categories. In one instance, the device undergoes DC testing in order to characterize the direct current behavior of the device. In the second category of test, the devices are placed under a RF probe in order to characterize the product's response to large signal radio frequency (RF) input. In step 320, if the device under test fails to pass any one of the DC tests or RF tests, the entire die lot from which the device was removed will be discarded (step 325). Only if all sample die from a single wafer pass both the DC test and the RF test will the wafer be delivered to the back-end process (step 340) for final product assembly. RF tests require the extraction and packaging of a die sample prior to testing. RF testing is also partly responsible for the low wafer sort yield that is accepted in the microchip fabrication industry today. Under the current testing methodology, if a device under test fails to meet predetermined performance specifications, the entire wafer from which that device was extracted is scrapped The current methodology is undesirable for a number of reasons. For one, the fate of each die on the wafer turns on the success or failure of a test performed on a very small subset of the devices on the wafer. Plenty of untested, but good die are consequently discarded, making the wafer sort stage a very wasteful process. Furthermore, the current testing methodology, which requires that the device under test be extracted from the wafer and packaged prior to testing, fails to isolate the parasitic effects of the package and other components from the effects of the tests on the device itself. This leads to innaccurate test results in many cases.

Thus, improvements in semiconductor wafer testing processes are desirable, especially those that increase wafer sort yield, while maintaining or improving the accuracy of the transistor device characterization process.

SUMMARY OF THE INVENTION

The present invention is directed to a system, and methods of its use, for characterizing semiconductor device wafers, such as LDMOS wafers in a preferred embodiment, by measuring small signal scatter parameter measurements of a representative sample of die to create a contour map of a wafer surface. Those die which fail to meet performance specifications are marked as bad die before the wafer is sent to a back-end process, where the unmarked good die are extracted and assembled into working products. By using enhanced S parameter mapping for characterizing the die, only those die marked as bad die need be discarded. Thus, instead of scrapping an entire wafer die lot based on the failure of a single die from that wafer, the wafer sort yield may be dramatically increased. The increase in wafer sort yield in turn, increases total production yield.

Other and further aspects and advantages of the present invention will become apparent from the following detailed description and accompanying drawings.

BRIEF DESCRIPTION OF THE DRAWINGS

In the figures of the accompanying drawings, like reference numbers correspond to like elements, in which:

FIG. 2 is a diagram summarizing the factors affecting yield and formulas associated with certain yield measurement points adapted from Van Zant, Peter, *Microchip Fabrication, A Practical Guide to Semiconductor Processing*, Fourth Edition, McGraw Hill, 2000, pp. 135–149.

DETAILED DESCRIPTION OF PREFERRED EMBODIMENTS

Figure 4:
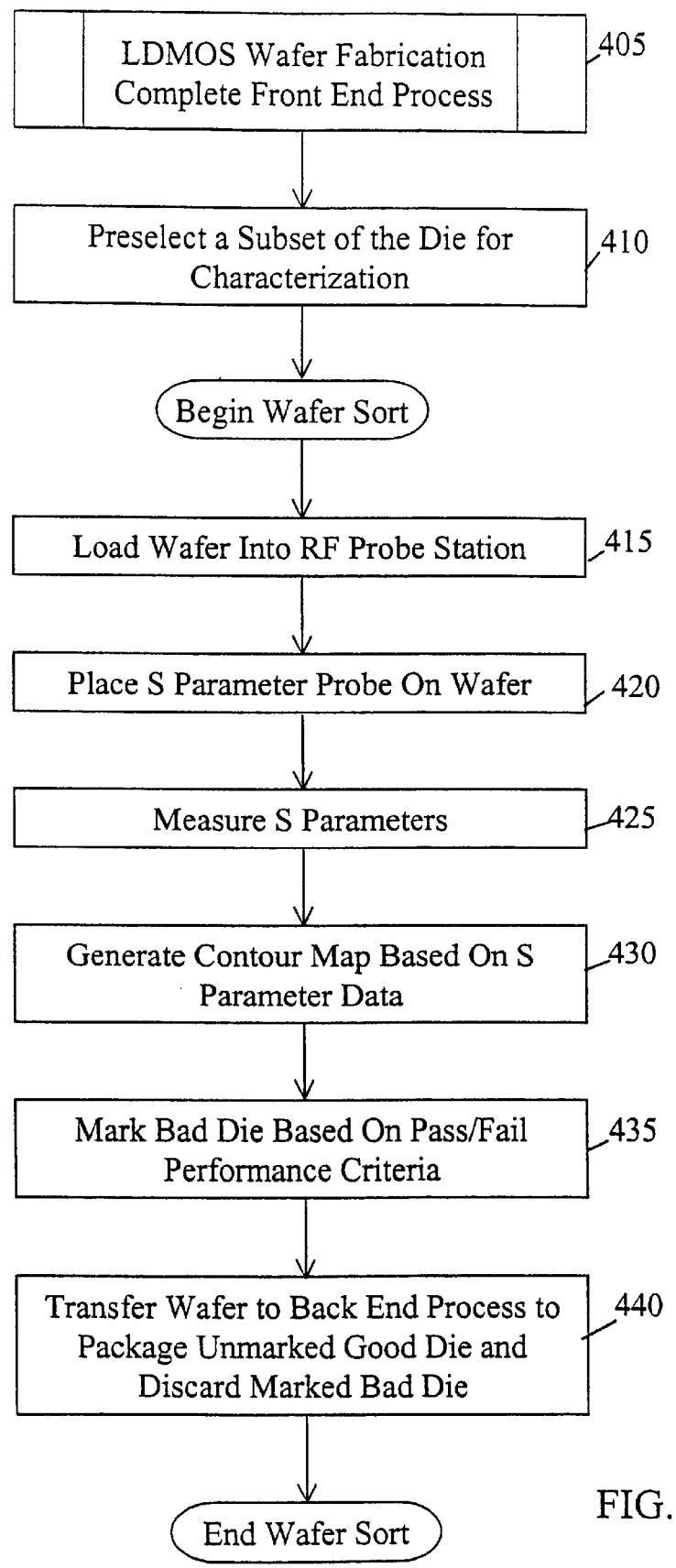
FIG. 4 is a flow diagram of an enhanced S-parameter contour mapping method for LDMOS wafer characterization according to the present invention.

FIG. 4 is a flow diagram of an enhanced S parameter contour mapping method for LDMOS wafer characterization according to one embodiment of the invention. The wafer characterization process aims to characterize the LDMOS wafer by measuring the small signal scatter parameters of a number of representative sample die.

Step 405 indicates that the method of enhanced contour mapping to characterize LDMOS wafers begins after the wafer has completed the front-end wafer fabrication process. A wafer at this stage contains a plurality of functional LDMOS transistor devices (often as many as a five hundred devices per wafer), arranged neatly on the wafer in a checkerboard fashion. These devices have endured the rigors of fabrication, which potentially includes layering, etching, annealing, masking, and other device fabrication processes, the result of which is a series of independently measurable LDMOS transistor die.

Figure 1:
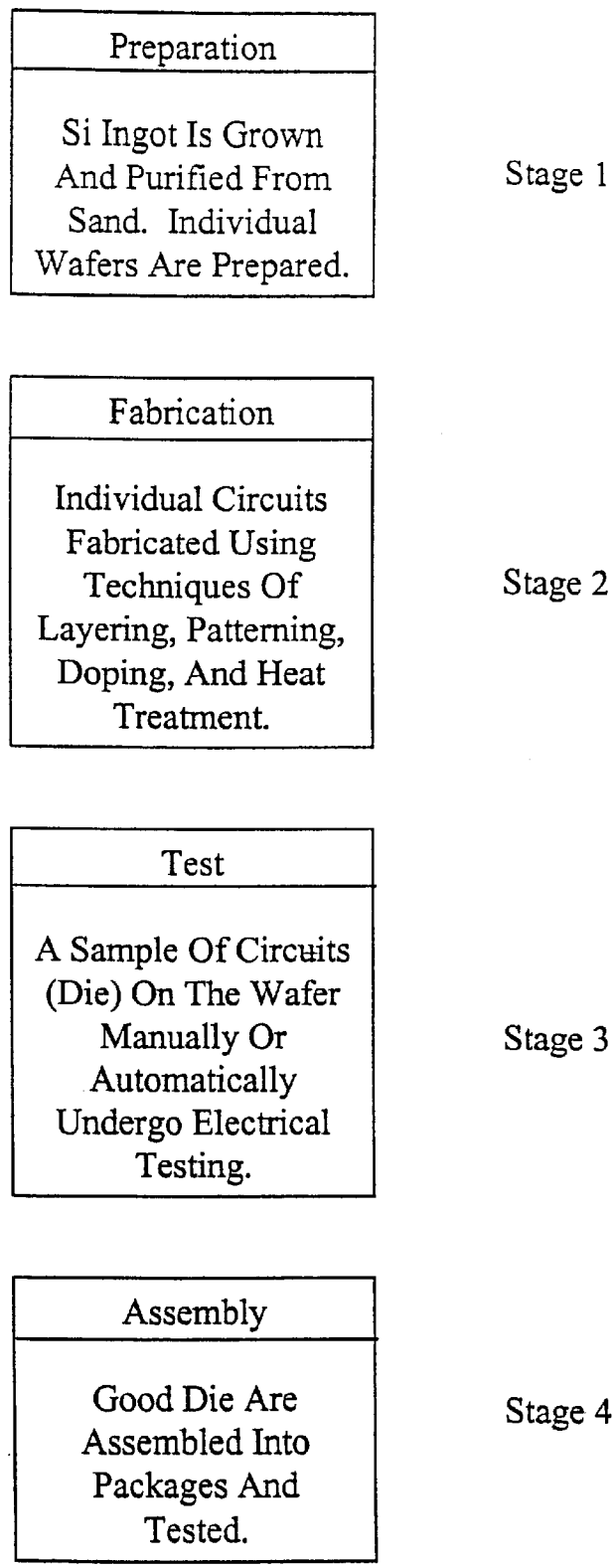
FIG. 1 is a simplified functional diagram representing the four stages of the semiconductor microchip fabrication process adapted from Van Zant, Peter, *Microchip Fabrication, A Practical Guide to Semiconductor Processing*, Fourth Edition, McGraw Hill, 2000, p. 85.
Figure 3:
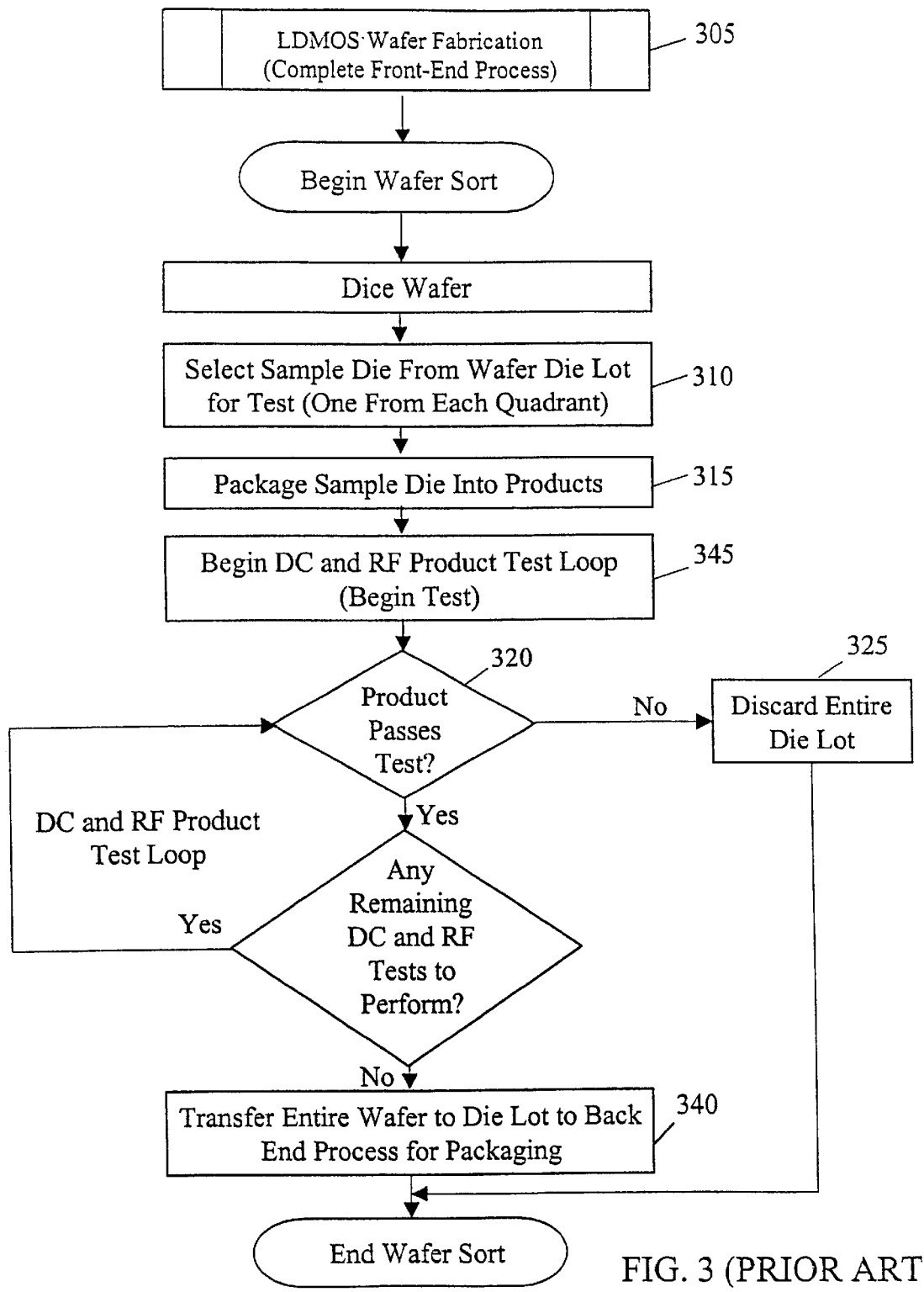
FIG. 3 is a flow diagram of a wafer sort methodology currently employed for testing LDMOS power transistor wafers.

In step 410 the test engineer pinpoints a representative number of die to be tested at the probe station. Testing every device on the wafer is both impractical and unnecessary. In one embodiment, the small signal scatter parameter data are extracted from a minimum of one die from each quadrant of the wafer in order to obtain a representative sample of die from across the surface of the wafer. In practice, however, the method of enhanced S parameter contour mapping for characterizing LDMOS wafers preferably uses a much higher sample rate. As an example, an LDMOS wafer containing 500 die may experience a sample rate of 10 percent, or fifty LDMOS devices to be tested, compared to a typical sample size of as low as four LDMOS devices per wafer using the method of FIG. 3.

In step 415, the wafer is loaded into a probe station to be readied for S parameter measurement. The probe station preferably includes a vector network analyzer, which provides an interface for interpreting the test results.

In step 420, an S parameter probe is placed on the wafer for measuring the small signal scatter parameters of the sample die on the wafer. The S parameter probe is cabled to the vector network analyzer, or other measurement device. The probe includes an input, which is coupled to a gate terminal, and an output, which is coupled to a drain terminal, respectively, of the LDMOS device to be measured. The ground reference (source) of the die is at the back metal of the wafer and is connected to the same ground plane as the probe.

In step 425, the test equipment measures the S parameters. Scatter parameter measurement is superior to RF parameter measurement because scatter parameter measurement applies a small signal to the device under test, whereas RF parameters measure the large signal characteristics of the device. In other words, RF parameters characterize the electrical behavior of a device. A typical RF test probe excites the device under test with a high power, large signal, forcing the device into a non-linear operating range. The non-linear device characteristics usually measured in a RF test include inter-modulation distortion, gain, and efficiency.

While these RF parameters are alone sufficient to fully characterize a device, the byproducts of non-linear RF testing on a pre-packaged device make this type of test unsuitable for use in a scheme designed to improve wafer sort yield. First, the large signal applied during RF testing causes the device under test to generate substantial heat. This heat must be dissipated in order to maintain the electrical integrity of the device throughout the test. A heat sink is often necessary; hence, a RF test cannot usually be performed while the device remains in the wafer. Prior to testing, the device must be cut from the wafer and assembled into a fully packaged and operable circuit in a manner that adequately dissipates the heat. Second, significant inaccuracies result from the RF measurements taken from a device that has been packaged prior to testing. The measurements often misread the parameters of the device itself because the packaging, wire bonds, and other circuit components introduce parasitic effects that skew the results of the measurement.

The small signal scatter parameter measurements ameliorate the disadvantages associated with RF testing. First, scatter parameter measurements require the device neither to be extracted from the wafer nor packaged prior to testing. Small signal perturbation of a device under test generates negligible heat. Thus, a separate mechanism for heat dissipation is not required, allowing the device to be tested while the device remains in tact within the wafer. Second, the scatter parameter test measurements are unaffected by the parasitic effects of any external circuit elements; hence, the measurement results are likely to accurately reflect the physical and electrical traits of the device itself.

Characterization techniques in general rely on the theoretical foundation of two-port network modeling. At low frequencies, the z, y, and h parameter sets may be used to fully characterize a two-port network. However, as a practical matter these parameters are inadequate for use in microwave device characterization because open- and closed-circuit test conditions are difficult to achieve over a broad range of high frequencies. Additionally, active 2-port devices have a tendency to oscillate under open- and closed-circuit conditions.

Instead, the familiar small signal scatter parameters (S parameters), popular since the 1970's, allow test engineers to characterize devices that operate at frequencies well into the microwave range. S parameters are practical due largely to the development of modem test equipment like network analyzers that can perform S parameter measurements with ease.

Figure 5:
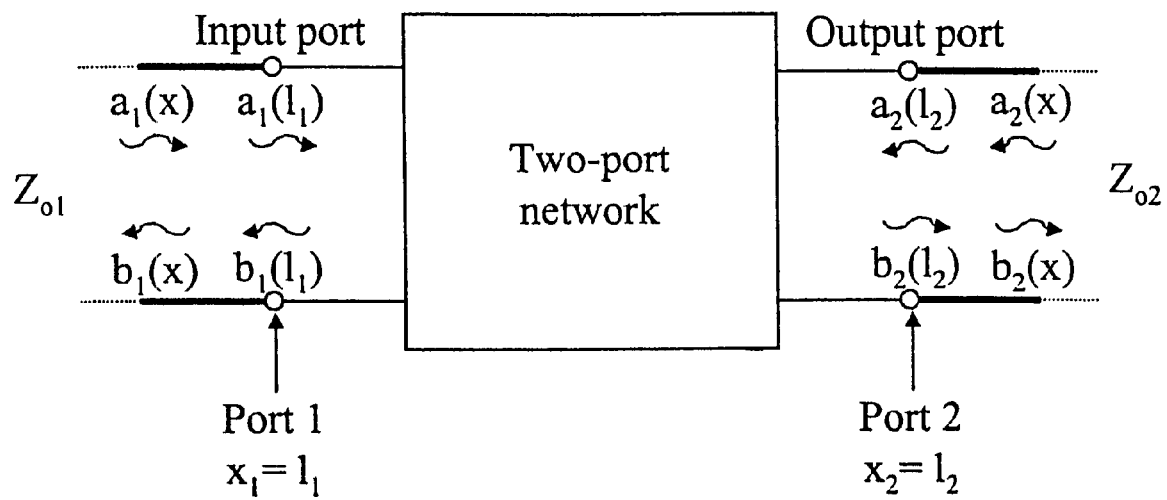
FIG. 5 is a diagram of a preferred two-port network used to derive the small signal scatter parameter coefficients in the method depicted in FIG. 4 adapted from Gonzalez, Guillermo, *Microwave Transistor Amplifiers Analysis and Design*, Second Edition, Prentice Hall, 1997, pp. 23–24.

FIG. 5 is a diagram showing a two-port network model used in deriving the small signal scatter parameters as adapted from Gonzalez, Guillermo, *Microwave Transistor Amplifiers Analysis and Design*, Second Edition, Prentice Hall, 1997, pp. 23–24. Small signal $a_1(x)$ is the traveling wave incident on the input port of the network; small signal $b_1(x)$ is the traveling wave reflected from the input port of the network. Similarly, small signal $a_2(x)$ is the traveling wave incident on the output port of the network, and small signal $b_2(x)$ is the traveling wave reflected from the output port of the network. The values $a_1(l_1)$, $a_2(l_2)$, $b_1(l_1)$, and $b_2(l_2)$ are the values of the incident and reflected waves at the specific locations denoted as port 1 and port 2 in FIG. 5. $Z_{o1}$ and $Z_{o2}$ are the characteristic impedances of the input and output transmission lines respectively.

The small signal scattering parameters are derived in terms of the incident and reflected travelling wave values at defined input and output port locations and in terms of defined input and output port termination conditions. In matrix notation the scattering parameters represent reflection and transmission coefficients and take the form:

$$\begin{bmatrix} b_1(l_1) \\ b_2(l_2) \end{bmatrix} = \begin{bmatrix} S_{11} & S_{12} \\ S_{21} & S_{22} \end{bmatrix} \begin{bmatrix} a_1(l_1) \\ a_2(l_2) \end{bmatrix}$$

or, in equation form, $$b_1(l_1) = S_{11} a_1(l_1) + S_{12} a_2(l_2)$$

and $$b_2(l_2) = S_{21} a_1(l_1) + S_{22} a_2(l_2)$$

where the scatter parameters measured at the specific location shown as port 1 and port 2 in FIG. 5 are defined as follows:

$$S_{11} = \left. \frac{b_1(l_1)}{a_1(l_1)} \right|_{a_2(l_2)=0} \quad \text{Input reflection coefficient with output properly terminated}$$

$$S_{21} = \left. \frac{b_2(l_2)}{a_1(l_1)} \right|_{a_2(l_2)=0} \quad \text{Forward transmission coefficient with output properly terminated}$$

$$S_{22} = \left. \frac{b_2(l_2)}{a_2(l_2)} \right|_{a_1(l_1)=0} \quad \text{Output reflection coefficient with input properly terminated}$$

$$S_{12} = \left. \frac{b_1(l_1)}{a_2(l_2)} \right|_{a_1(l_1)=0} \quad \text{Reverse transmission coefficient with input properly terminated}$$

The S parameters are frequency-dependent; hence, device characterization often includes a measure of the scatter parameters across a range of frequencies. If the device in a two-port network is a transistor, the transistor must be properly biased, meaning the transistor scatter parameters are measured at a single quiescent operating point (i.e., Q point). Moreover, because the scatter parameter model is a small signal model; small signal conditions must be maintained throughout the measurement process.

Impedance matching is critical in order to produce accurate test results, for example, an accurate measure of the input reflection coefficient requires that the output be properly terminated. To achieve this result, the output must be terminated with an impedance equal to the characteristic impedance of the transmission line. This will ensure that $a_2(l_2)=0$. In other words, the goal of total energy absorption is met and no travelling wave energy will be returned to the output port. Furthermore, measurements taken under the proper impedance matching test conditions means that the transistor will not oscillate.

The present invention recognizes that the S parameter measurements are workable alternatives to RF measurements on account of a strong positive correlation between the small signal results and the RF results that would predictably arise if the RF test were performed. This correlation ensures, with statistically high certainty, that the results of S parameter measurement will reliably predict the outcome of the RF test. In particular, the present invention recognizes that a contour map can be generated from the measured S parameter data of each die, or a selected subset of die, relative to some predefined pass/fail criteria. The resulting contour map provides a visual indication, or "characterization," of the relative pass/fail criteria for each die on a wafer, whereby die that do not meet the predefined criteria can be marked as bad die to be discarded subsequent to dicing the wafer. Thus, by employing S parameter contour mapping, the fate of a single wafer never hangs completely in the balance due to a single pass or fail proposition, as it does under the prior art methodology illustrated in FIG. 3.

Returning to FIG. 4, in step 430, a computer system attached to the probe equipment generates a contour map based on the small signal scatter parameter data extracted in step 425. A contour map is a computer-generated, virtual plot of a wafer surface made up of contour lines, where each contour line "passes through" those die having a constant value for some measurable circuit parameter. Contour mapping is readily accomplished by using the small signal scatter parameter data extracted during the S parameter measurement as input to a computer software program. For example, a computer automated design (CAD) system software package is capable of modeling an LDMOS transistor's performance by applying predetermined mathematical formulas to the performance data supplied to the system by the wafer test equipment.

Figure 6:
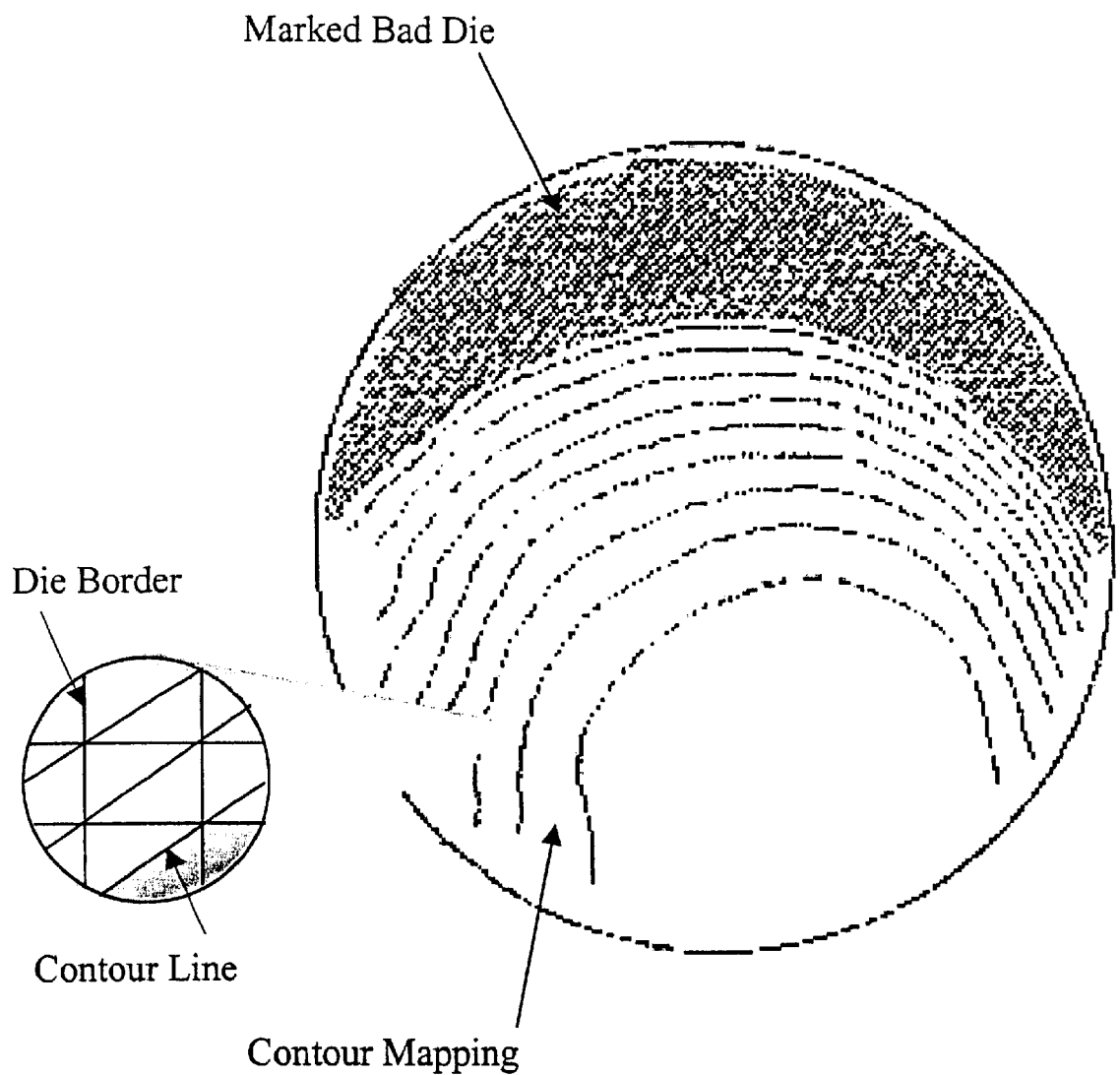
FIG. 6 is a diagram of an example computer-generated display representing an exemplary contour map on a wafer.

FIG. 6 is an example of a display that might be produced by such a CAD program. The inset view shows the relative size of the die in relation to a contour line. The die make up a uniformly spaced checkerboard patchwork across the wafer surface. The contour lines pass from die to neighboring die such that no two contour lines pass through the same die and no die is skipped. Also, because the method of enhanced S parameter contour mapping for characterizing LDMOS wafers tests only a sample number of die, the method relies on interpolation to create the contour map.

Typical of LDMOS wafers fabrication is a uniform gradient with which a contour passes from device to device. In other words, abrupt changes in S parameter values from device to neighboring device is not common. Using the doping process as an example, the lack of uniformity in doping ion concentration from one area of the wafer to the next is likely change gradually. Thus, the contour lines, each of which might represent a different value for a parameter, tend to be somewhat evenly spaced and pass through neighboring die in a smooth fashion as depicted in FIG. 6. Therefore, abrupt "zig zag" contour lines, contour islands, or discontinuities in a contour line are not as likely.

The performance criteria and tolerance levels are usually preset by the design engineer. The test engineer makes sure that the S parameter measurements conform to the design criteria set by the design engineer. The performance criteria are based on a predetermined notion of what tolerances are acceptable for a particular device. The contour mapping algorithm of the software package used to characterize the wafer is responsible for developing contours which unambiguously indicate which devices fail to meet the performance criteria and which devices meet the criteria.

As an example, a design engineer may set the acceptable threshold of performance for $S_{21}$, the forward transmission coefficient, for a particular LDMOS transistor to 18 dB. If the S parameter test reveals an $S_{21}$ measurement of 15 dB, then the device will be deemed bad by the contour mapping algorithm. As another example, an acceptable threshold for $S_{11}$, the input reflection coefficient, might be set by the designer at –20 dB. Any device whose $S_{11}$ measurement exceeds this value (in an absolute sense) would be deemed acceptable by the contour mapping algorithm. In other words, an $S_{11}$ measurement of –30 dB would pass the test.

In step 435 of FIG. 4, those die which fail to meet standard performance criteria are marked as bad die. A small blot of ink is usually deposited on the surface of the bad die by an ink probe. The ink probe is distinct from the S parameter test probe used to measure the small signal scatter parameters. Those die which meet the standard performance criteria are left unmarked as good die.

In step 440 the entire wafer is transferred to a back-end process for dicing where the good die will be physically removed from the wafer and used to build devices. The bad die will be discarded.

In addition to the advantages already proffered, the method of enhanced S parameter contour mapping for characterizing LDMOS wafers offers better process quality monitoring. Errors in the fabrication process that may be isolated within a limited region of the wafer are not often spotted by the testing methodology of FIG. 3. The larger sample size, uniform distribution, and complete wafer characterization provided by the S parameter contour map is capable of uncovering latent process errors that might otherwise elude detection.

Figure 7:
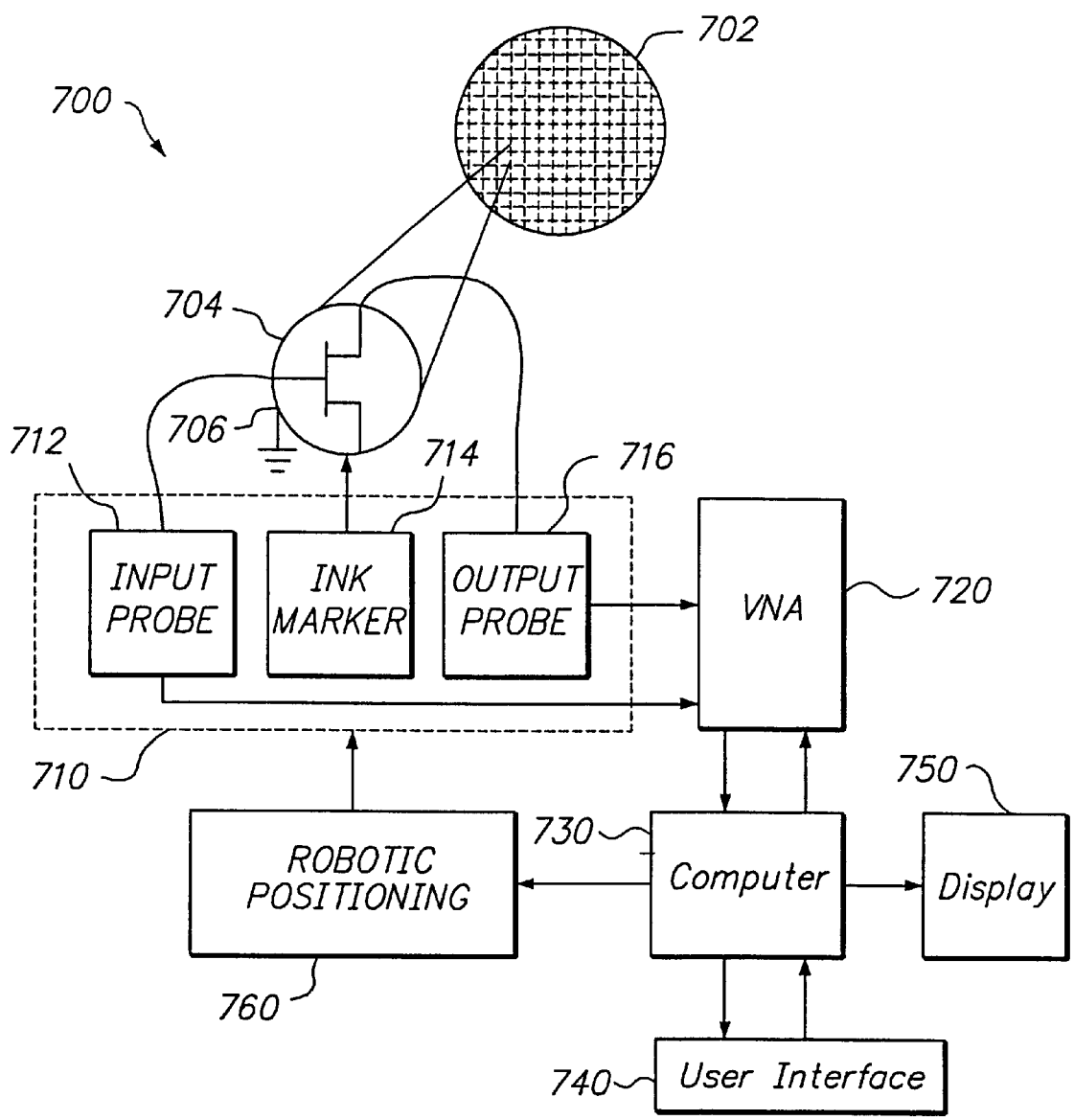
FIG. 7 is a schematic block diagram of a system for performing the enhanced S-parameter contour mapping method of FIG. 4.

FIG. 7 illustrates a measuring system 700 for performing the above-described enhanced S-parameter contour mapping method, in accordance with the invention. The measuring system 700 includes a probe station 710 having an input probe 712 for coupling to a gate terminal and an output probe 716 for coupling to a drain terminal, respectively, of a LDMOS device formed on a die 704 of a wafer 702. Notably, the ground reference 706 (source) of the die is at the back metal of the respective wafers being evaluated and is connected to the same ground plane as the measuring system 700 during the evaluation. A vector network analyzer 720 is coupled to the input and output probes 712 and 716 for measuring the small signal scatter parameter data of a given die using the respective probes. A processor (e.g. computer 730) is coupled to the vector network analyzer 720 for compiling a contour map of small signal scatter parameter data measured from a plurality of die 704 on a wafer 702, the contour map identifying each respective die 704 as either meeting or failing a performance criteria. The system further includes a user interface 740 and display 750 (e.g., for displaying a contour map of a respective wafer 702) to allow for user control and oversight of the die evaluation and contour mapping process.

The measuring system 700 employs robotic positioning 760 in order to precisely position the respective input and output probes 712 and 716 on the respective die 704 of a wafer 702. The robotic positioning 760 is preferably controlled by the computer 730, which selects the particular die 704 on the wafer 702 for evaluating and mapping. In this manner, selection of the die 704 to be evaluated and movement of the probes 712 and 716 relative to the wafer 702 are automated and controlled by the computer 730. For example, one or more software S-parameter mapping algorithms may be stored in the computer 730. In an alternate embodiment, selection of particular die 704 on a given wafer 702 to be evaluated and/or movement of the input and output probes 712 and 716 relative to the wafer 702 may be performed manually. The probe station 710 includes a marker 714 for identifying die 704 on a given wafer 702 that fail to meet a given performance criteria. The marker 714 is controlled by the computer 730 via the robotic positioning 760. Again, in an alternate embodiment, the control of the marker 714 may be manual.

While embodiments and implementations of the subject invention have been shown and described, it should be apparent that many more embodiments and implementations are within the scope of the subject invention. By way of example, while the preferred embodiments and implementations are directed to LDMOS wafer characterization, the inventive concepts may be equally applied to other types of transistor devices, such as bi-polar and MOSFET.

Accordingly, the invention is not to be restricted, except as set forth in the claims and their equivalents.

What is claimed:

1. A method for characterization of a wafer comprising a plurality of die containing transistor devices, comprising:
    selecting a subset of die for characterization;
    measuring the small signal scatter parameter data of each die of the selected subset; and
    forming a contour map from the small signal scatter parameter data, identifying each die as either meeting or failing a performance criteria.

2. The method of claim 1, further comprising marking those die which fail to meet the performance criteria.

3. The method of claim 1, the wafer having quadrants, wherein the selected subset comprises at least one die from each quadrant of the wafer.

4. The method of claim 1, wherein measuring the small signal scatter parameter data includes loading the wafer into a probe station.

5. The method of claim 1, wherein measuring the small signal scatter parameter data is performed using a two-point probe device.

6. The method of claim 5, wherein the two-point probe device is coupled to a vector network analyzer.

7. The method of claim 2, wherein marking those die which fail the performance criteria comprises depositing on the respective die surface a visible amount of ink.

8. The method of claim 7, wherein the deposited ink is fully contained within the boundary of the respective die.

9. The method of claim 2, further comprising extracting the unmarked die from the wafer for use in a back-end process.

10. The method of claim 9, wherein the unmarked die are extracted by employing scribing or sawing.

11. The method of claim 1, wherein the transistor devices are LDMOS devices.

12. A system for characterizing a plurality of die on a wafer, each die comprising a transistor device, the system comprising:

a probe station having an input probe for coupling to an input terminal and an output probe for coupling to an output terminal, respectively, of a transistor device formed on a die of a wafer;

a vector network analyzer coupled to the input and output probes for measuring small signal scatter parameter data of a die coupled to the respective input and output probes; and a processor coupled to the vector network analyzer for compiling a contour map of small signal scatter parameter data measured from a plurality of die on a wafer, the contour map identifying respective die as either meeting or failing a performance criteria.

13. The system of claim 12, wherein the transistor devices are LDMOS devices.

14. The system of claim 12, further comprising a marker for identifying die on a given wafer that fail to meet a performance criteria.

15. The system of claim 12, further comprising a user interface.

16. The system of claim 12, further comprising a display.

17. The system of claim 12, further comprising a positioning mechanism for positioning the input and output probes relative to individual dies on a wafer.

18. The system of claim 17, wherein the positioning system is robotic.

19. The system of claim 12, wherein selection of die on a wafer to be evaluated and mapped is controlled by the processor.

20. A system for characterizing wafers comprising a plurality of die containing transistor devices, the system comprising:

means for selecting a subset of die for characterization;

means for measuring the small signal scatter parameter data of each die of the selected subset; and means for forming a contour map from the small signal scatter parameter data, identifying each die as either meeting or failing a performance criteria.

21. The system of claim 20, further comprising means for marking those die which fail to meet the performance criteria.

22. The system of claim 20, the wafer having quadrants, wherein the selected subset comprises at least one die from each quadrant of the wafer.

23. The system of claim 20, wherein the means for measuring small signal scatter parameter data comprise a probe station.

24. The system of claim 20, wherein the means for measuring small signal scatter parameter data comprise a two-point probe device.

25. The system of claim 24, further comprising a vector network analyzer coupled to the two-point probe device.

26. The system of claim 21, wherein the means for marking those die which fail the performance criteria comprises means for depositing a visible amount of ink on the respective die surface.

27. The system of claim 26, wherein the deposited ink is fully contained within the boundary of the respective die.

28. The system of claim 21, further comprising means for extracting the unmarked die from the wafer for use in a back-end process.

29. The system of claim 28, wherein the means for extracting unmarked die comprise one or more of a scribe and a saw.

30. The system of claim 20, wherein the transistor devices are LDMOS devices.

* * * * *